US005633495A

United States Patent [19]

Niehuis

[11] Patent Number: 5,633,495

[45] Date of Patent: May 27, 1997

[54] PROCESS FOR OPERATING A TIME-OF-FLIGHT SECONDARY-ION MASS SPECTROMETER

[75] Inventor: Ewald Niehuis, Senden, Germany

[73] Assignee: ION-TOF GmbH, Muenster, Germany

[21] Appl. No.: 578,646

[22] PCT Filed: May 10, 1995

[86] PCT No.: PCT/EP95/01767

§ 371 Date: Feb. 9, 1996

§ 102(e) Date: Feb. 9, 1996

[87] PCT Pub. No.: WO95/31000

PCT Pub. Date: Nov. 16, 1995

[30] Foreign Application Priority Data

May 10, 1994 [DE] Germany .......................... 44 16 413.0

[51] Int. Cl.$^6$ .......................... H01J 49/40; H01J 37/252; G01N 23/225

[52] U.S. Cl. .......................................... 250/287; 250/309

[58] Field of Search .................................... 250/287, 286, 250/288, 309

[56] References Cited

U.S. PATENT DOCUMENTS 5,396,065 3/1995 Myerholtz et al. .................... 250/287

OTHER PUBLICATIONS

Schwieters et al, Journal of Vacuum Science & Technology A 9 (6), Nov./Dec. 1991, pp. 2864–2871.

*Primary Examiner*—Jack I. Berman
*Attorney, Agent, or Firm*—Furgang & Milde, L.L.P.

[57] ABSTRACT

The invention pertains to a process for operating a time-of-flight secondary ion mass spectrometer for analysis of mass spectra, wherein a number of finely structured mass ranges appear in isolation at major intervals, involving the following steps: a) a surface of a material sample is bombarded with primary ion pulses that follow each other at regular time intervals $t_z$ (cycle time), b) the secondary ions of various masses m released from the material sample surface by the primary ions are accelerated to the same energy, c) the mass-dependent time of flight t is measured over a path 1 and the mass is determined therefrom. To increase the resolution and the signal-to-noise ratio the process is characterized in that: d) each primary ion pulse consists of a number of subpulses, e) each subpulse is so narrow that it allows for resolution of the finely structured mass ranges, g) the number n of subpulses is selected so that $n \cdot t_B$ is smaller than the intervals between the finely structured mass ranges, h) the n subpulse spectra of each finely structured mass range are added up.

3 Claims, 7 Drawing Sheets

PROCESS FOR OPERATING A TIME-OF-FLIGHT SECONDARY-ION MASS SPECTROMETER

BACKGROUND OF THE INVENTION

The present invention concerns a method of operating a time-of-flight secondary-ion mass spectrometer for the purpose of analyzing mass spectra wherein several finely structured ranges of mass appear in isolation and widely separated, whereby a) the surface of a sample of material is bombarded at regular intervals (cycle times $t_z$) with primary-ion pulses, b) secondary ions of different mass are thereby released from the surface and are accelerated to the same level of energy, c) their mass-dependent time t of flight over a path 1 is measured and their mass determined therefrom.

Time t of flight is proportional to the mathematical square root of the mass (t proportional $\sqrt{m}$) in this situation. The number of secondary ions equivalent to a particular mass m yield within a specified cycle time $t_z$ fine-structure maxima within "nominal ranges". Each nominal range corresponds to a whole-number atomic or molecular weight of elemental or molecular ions. The amplitudes of the fine-structure maxima allow qualitative and quantitative analyses of the composition of the sample's surface.

Time-of-flight secondary-ion mass spectrometer (TOF-SIMS) is known (from e.g. *Analytical Chemistry* 64 (1992), 1027 ff and 65 (1993), 630 A ff). It is employed for the chemical analysis of solid surfaces.

The surface of a sample is bombarded with a pulsed beam of primary ions at a pulse duration $t_p$. The beam releases secondary ions from the surface. The free secondary ions are accelerated to the same level of energy E (a few KeV) in an extraction field and then travel along a flight path 1. At the other end of the path they are detected by a time-resolving detector. The great majority of secondary ions are simply charged.

The secondary ions' time of flight can be represented by $$t=1/v\ 1/\sqrt{2E}\cdot\sqrt{m}=k/m \qquad (1)$$

The precise mass of a secondary ion can accordingly be calculated at constant energy from the detected time t of flight.

The secondary ions are registered in accordance with the desired range of masses within a specific interval, cycle time $t_z$, subsequent to the impact of a primary-ion pulse. From equation (1), $$t_z=k/m_{max} \qquad (2)$$

where $m_{max}$=the largest mass within the desired range. The next primary-ion pulses can impact the sample once cycle time $t_z$ has lapsed. Times of flight t are accordingly measured at a frequency of repetition $f=1/t_z$. Very few secondary ions, typically 0.1 to 10, are released and detected per cycle. A mass spectrum of adequate dynamics over several orders of magnitude, meaning an adequate ratio between the highest and lowest intensities, can be obtained by accumulating the counting events over a large number of cycles. The measurements typically take 100 to 1000 seconds.

Both elemental and molecular ions are released from the surface of the probe. The precise mass of a secondary-ion species, which can be either elemental or molecular, equals the sum of its atomic weights. Since the individual atomic weights deviate slightly from integral values due to the binding energy of the atomic nuclei, each aforesaid nominal-mass range will be found on each side of an integral value. The precise masses of elemental and molecular ions differ only slightly. One example of a secondary-ion species is 27 u: $aluminum_+$: 26.99154 u: $C_2H_3^+$: 27.023475 u. The various species of secondary ions can be separated and resolved into fine-structure maxima, that is, if the mass resolution is high enough, and elements and compounds can be detected separately. The separation of such species is an essential prerequisite for demonstrating traces of compounds and elements. The mass resolution m/DELTAm employed in time-of-flight secondary-ion mass spectrometry relates to the mass difference DELTAm at which a mass m can still be separated into fine-structure maxima at. It depends decisively on primary-ion pulse duration $t_p$. Other factors involved in the separation are the resolution capacity of the time-of-flight analyzer and the time resolution of the detector and recording electronics. Improving these factors are not, however, an objective of the present invention.

Time-of-flight secondary-ion mass spectrometry is employed not only to analyze the composition of surfaces, but also allows the detection of lateral distributions of various elements and compounds at a high local resolution, in the sub-μ range. The beam of primary ions is for this purpose focused on a very small point and gridded over the sample by means of a deflecting method. In imaging spectrometry, a mass spectrum is obtained and evaluated for every point on the grid. A distribution image can then be generated from the results for a number of points on the grid (typically 356×256). In deep-distribution analysis, the sample can be abraded with the primary beam or by an additional source of ions and a depth distribution of the various species established by analyzing each successive surface.

The primary-ion pulse duration necessary for high mass resolution is only a few nanoseconds for a typical drift of approximately 2 m. The pulses are generated by an appropriate beam-pulsing procedure from a static beam deriving from a source of ions. The number $N_p$ of primary ions per pulse derives from the static current $I_p$ through the ion source and pulse duration $t_p$ in the form $$N_p=I_p\cdot T_p/e \qquad (3)$$

wherein e is the elementary charge.

It will accordingly be evident that the number of primary ions per pulse will decrease with the length of the pulse. Consequently, more primary-ion pulses will be necessary to generate and detect the same number of secondary ions. This means that the measurement time will increase. The increased measurement time is a particular problem in the analyses of microscopically dimensioned areas with finely focused ion sources because the available ion-source currents $I_p$ are very small. The recording of spectra of higher dynamics, of lateral distributions, and of distributions in depth often result in measurement times of more than one hour to several hours.

Measurement times can be decreased at the state of the art only by prolonging primary pulse duration $t_p$, which is accompanied by a loss in mass resolution, or by increasing the rate of repetition, which is accompanied by restrictions in the mass range that can be covered (cf. Eq. 2).

SUMMARY OF THE INVENTION

The principal object of the present invention is to provide a method of operating a time-of-flight secondary-ion mass spectrometer that will employ shorter measurement times without loss of mass resolution or reduction of mass range.

This object is attained in accordance with the present invention in a method of the aforesaid type wherein:

d) every primary-ion pulse comprises several subsidiary pulses, e) every subsidiary pulse is short enough to allow resolution of the fine-structured measurement ranges, f) the interval $t_B$ between subsidiary pulses is longer than the fine-structured measurement ranges are wide, g) the number n of subsidiary pulses is selected to ensure that $n \cdot t_B$ is smaller than the distances between the fine-structured measurement ranges, and h) the n spectra associated with the subsidiary pulses in each fine-structured measurement range are added together. In other words, the surface is bombarded not with a single brief burst of primary ions during time $t_z$ (Eq. 2) but with a series of several essentially identical subsidiary pulses at brief intervals during cycle time $t_z$. The interval between two subsidiary pulses is greater than the time-of-flight difference between elemental and molecular ions in a whole-number nominal mass. Again, the interval between the first and last primary-ion subsidiary pulse is less than the time-of-flight difference between the nominal masses in the detected measurement range. The n resulting fine maxima can be added to significantly improve the measurements' signal-to-noise ratio without increasing the measurement time. The series preferably comprises n=3 to n=20 subsidiary pulses.

The device for carrying out the method in accordance with the present invention is accordingly a time-of-flight secondary-ion mass spectrometer wherein the surface of a sample is bombarded by pulsed primary ions (primary-ion pulses) that release secondary ions of varying mass from the surface. The secondary ions are subjected to the same level of energy E once they have been released. The mass-dependent time t of flight is then measured along a path 1 with time t proportional to the mathematical square root of the mass, The number of secondary ions equivalent to a particular mass m yield within a specified cycle time $t_z$ fine-structure maxima that correspond more or less to a whole-number atomic or molecular weight of elemental or molecular ions. The amplitudes of the fine-structure maxima allow qualitative and quantitative analyses of the composition of the sample's surface. The device is characterized by a source of pulsed primary ions that can bombard the surface of the sample within time $t_z$ with a series of n essentially identical primary ions at brief intervals $t_B$, whereby the interval $t_B$ between two primary-ion pulses is greater than the time-of-flight difference between the elemental and molecular ions in a nominal-mass range, whereby the interval $t_A = n \cdot t_B$ between the first and last primary-ion pulse is shorter than the time-of-flight difference between the nominal masses in the detected range, and whereby the n time-of-flight secondary-ion mass spectrometer associated with the same species of secondary ions can be added.

One embodiment of the method and of the device in accordance with present invention will now be specified with reference to the accompanying drawings.

BRIEF DESCRIPTIONS OF THE DRAWINGS

FIG. 2 is a mass spectrum obtained in accordance with the state of the art, whereby

FIG. 3 is a mass spectrum obtained in accordance with the present invention, whereby

FIG. 1 illustrates the principle of time-of-flight secondary-ion mass spectrometry. A continuous source IQ of pulsed primary ions is pulsed by an appropriate beam pulser PS, resulting in the aforesaid primary-ion pulses.

DESCRIPTION OF THE PREFERRED EMBODIMENTS

The pulsed beam is filtered through a mass filter MF and focused on and positioned over a sample P (target) with a focusing mechanism FK and a grid mechanism RS. All the simply charged secondary ions released by the primary-ion beam are accelerated by a suction voltage $U_{ac}$ to the same level of energy E. Their running time is then measured in a time-of-flight analyzer FZA with spatial and temporal focusing properties. Identification is through an appropriate time-resolving ion detector ID. The pulses leaving the detector are processed by the recording electronics, which comprise a discriminator DS and a time-to-digital converter TDC in conjunction with a rapid-acting memory.

Figure 1:
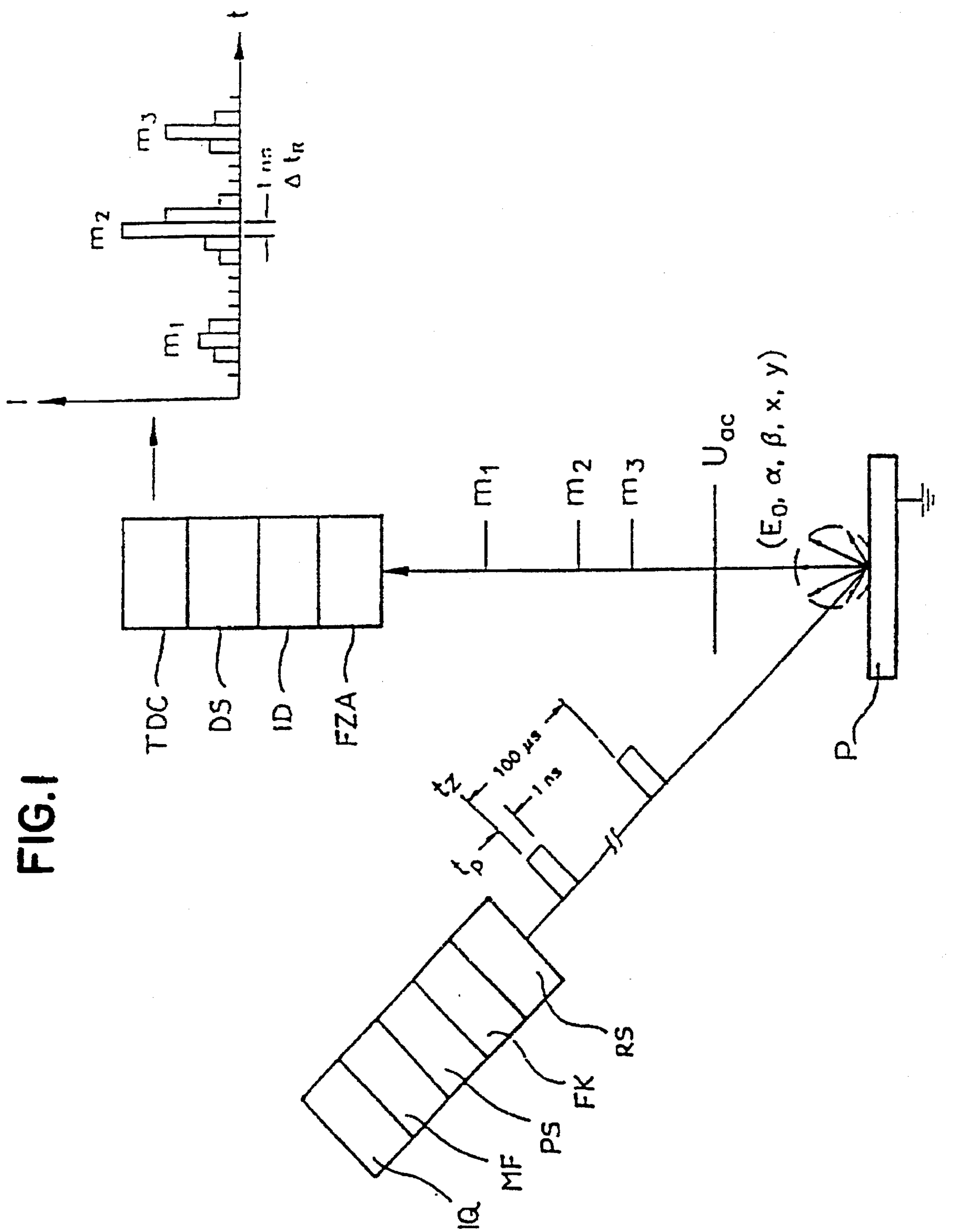
FIG. 1 is a schematic illustration of a time-of-flight mass spectrometer.
Figure 2A:
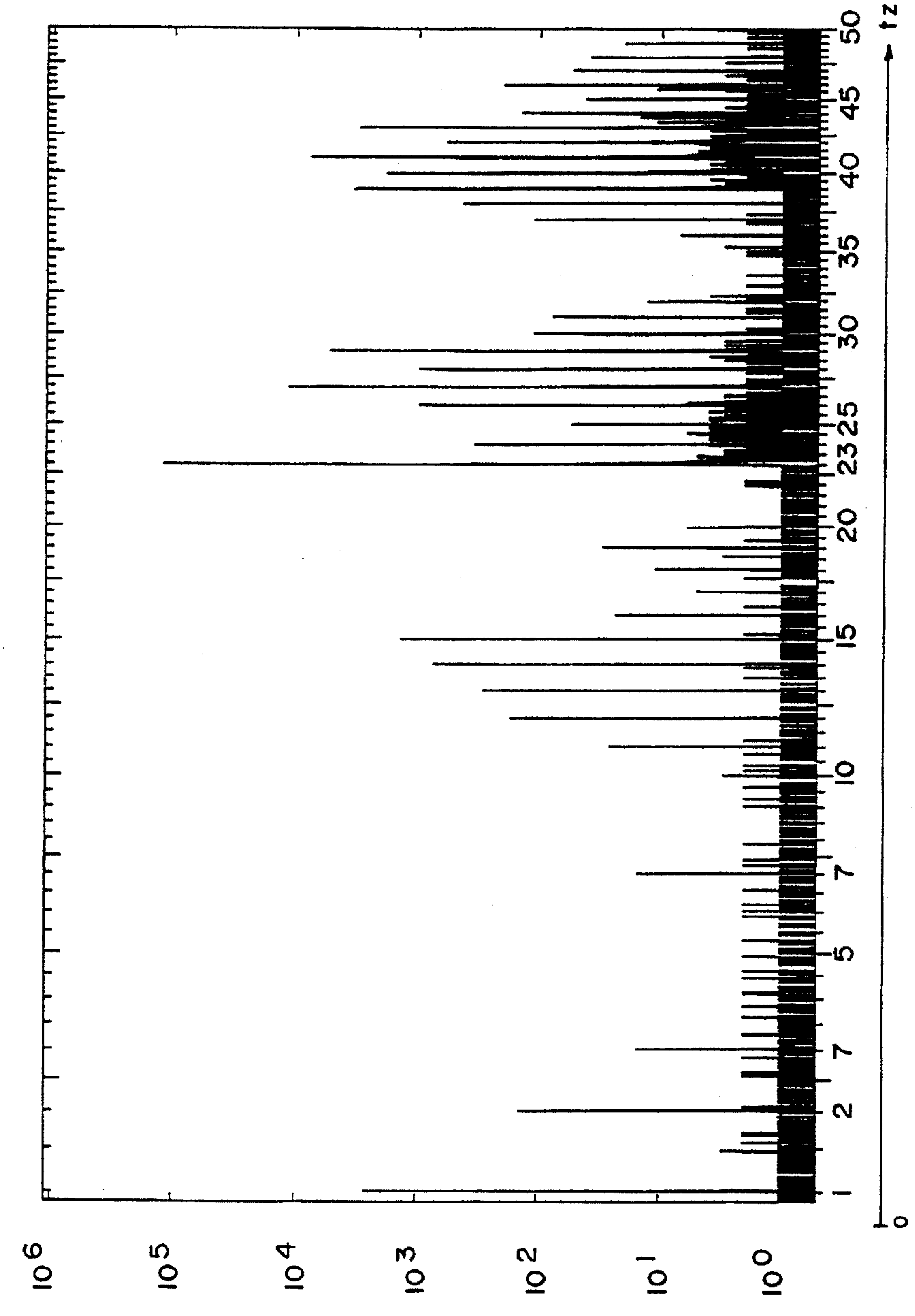
FIG. 2*a* is an overall view in the 1–50 range.
Figure 2B:
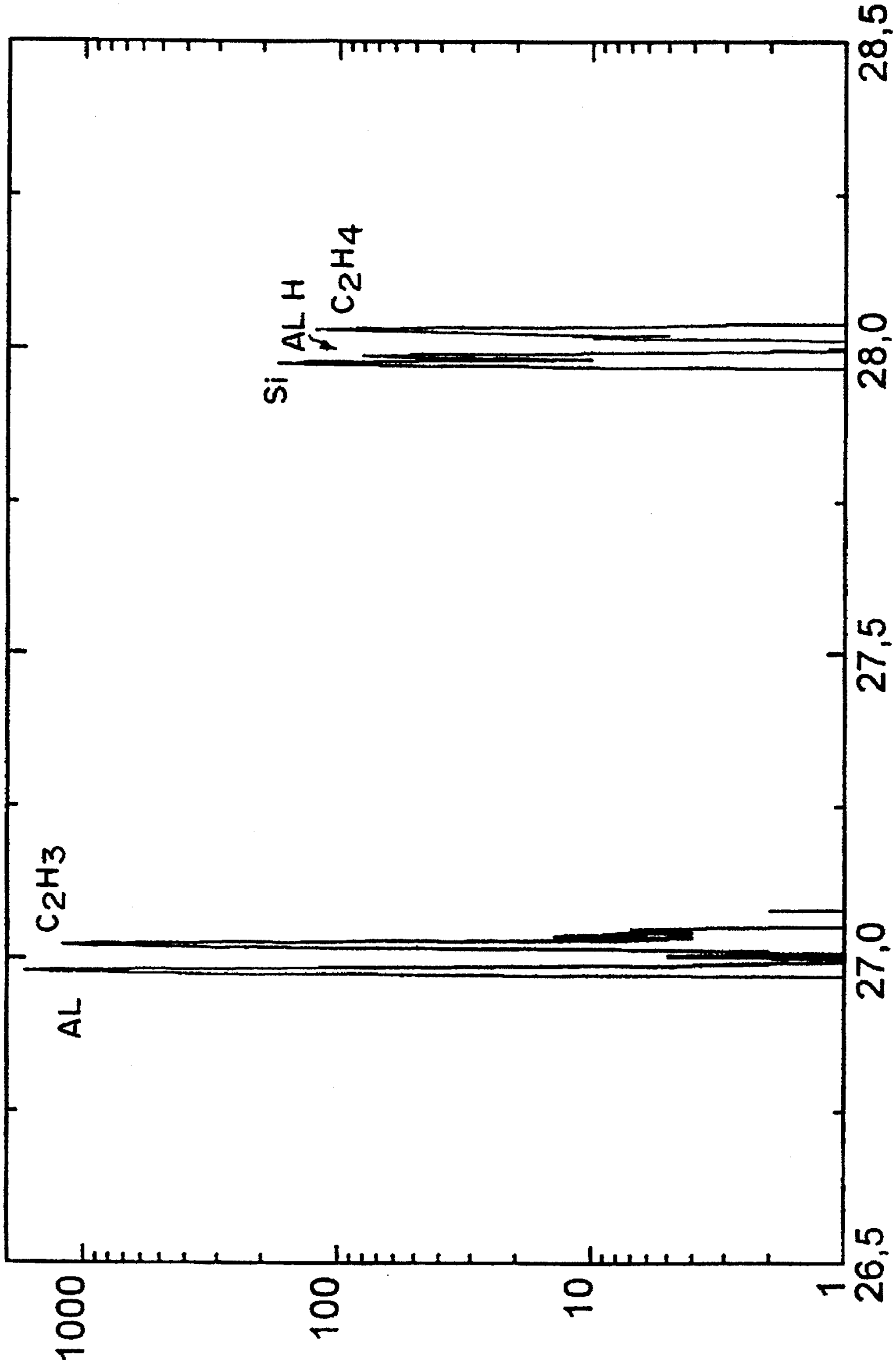
FIG. 2*b* is a detail of the 26.5–28.5 range.

FIGS. 2*a* and 2*b* illustrate results typical of the state of the art. A single primary-ion pulse lasting 1.3 nsec is generated per cycle time $t_z$. The released secondary ions are recorded for a cycle time of 100 µsec, and all events are added for a total of $1695 \cdot 10^7$ cycles. Total measurement time is accordingly 1695 seconds, or 28 minutes. The sample in the present example is a silicon wafer with an aluminum test structure. FIG. 2*a* is a view of the whole measurement range (nominal masses) from 1 to 50 u.

FIG. 2*b* is a detail illustrating the fine structure of the maxima in the range of 26.5 to 28.5 u from the spectrum illustrated in FIG. 2*a*. The separation between various atomic and molecular ions is evident due to the high mass resolution. At nominal mass 27 there is a separation into $Al^+$and $C_2H_3^+$. At nominal mass 28 there is a separation into $Si^+$, $AlH^+$, and $C_2H_4$. Due to the precise masses of the elements in the periodic system there can be no more maxima between those of nominal masses 27 and 28, between $C_2H_3^+$ and $Si^+$ for example.

Figure 3A:
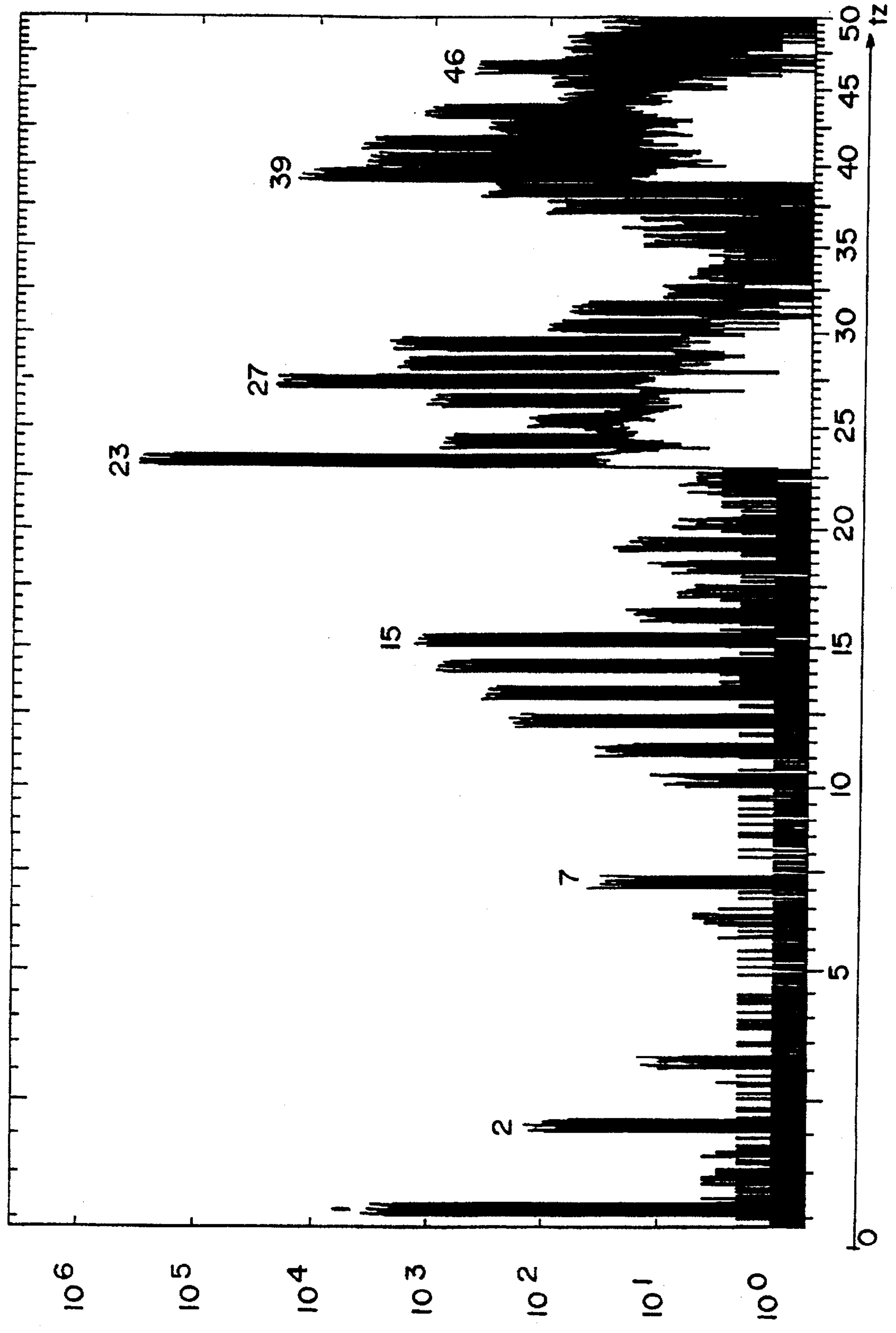
FIG. 3*a* is an overall view in the 1–50 range.
Figure 3B:
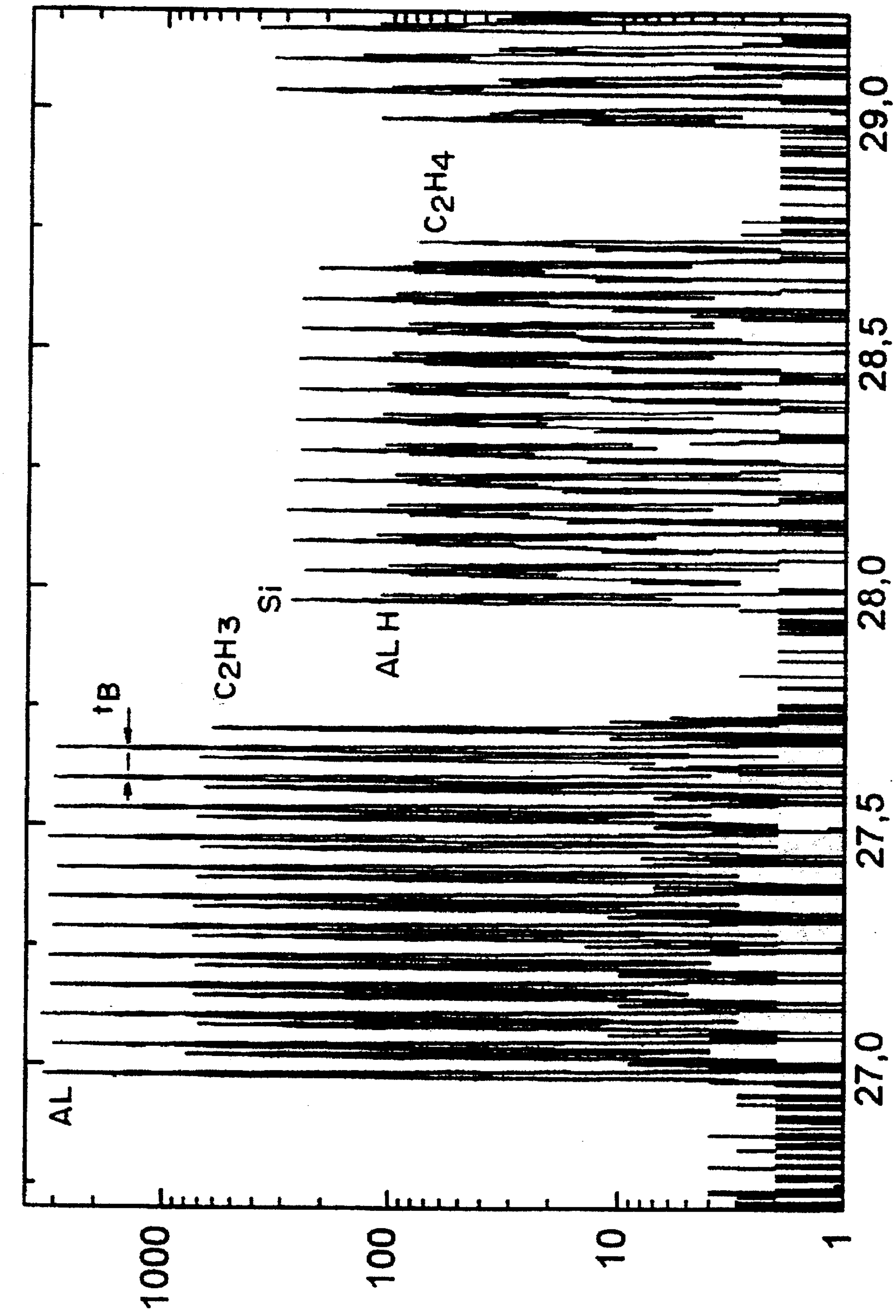
FIG. 3*b* is a detail of the 26.5–28.5 range.

To substantially decrease measurement time or to increase the number of secondary ions recorded during a given measurement time and hence increase the dynamics, the method in accordance with the present invention and illustrated in FIGS. 3*a* and 3*b* can be employed.

FIG. 3*a* is an overall view of the range from 1 to 50 u. The separation between the various nominal masses is obvious. The time-of-flight difference between m=49 and m=50 is accordingly greater than 12·25 nsec=300 nsec.

FIG. 3*b* illustrates the fine structure of the same spectrum in the range of 26.5 to 28.5 u. The 12-fold superposition onto the peak structure from FIG. 2*b* of the 12 subsidiary pulses at definite intervals will be obvious. The interval of 25 nsec eliminates an overlap of the maxima belonging to different primary-ion pulses, allowing association of the peak series with a specific compound. As in FIG. 2*b*, the maxima for $Al^+$ and $C_2H_3^+$ are indicated at nominal mass 27 and the maxima for $Si^+$, $AlH^+$,} and $C_3H_4^+$ at nominal mass 28.

All the events are again added over $1695 \cdot 10^7$ cycles. The measurement time is again, as in FIGS. 2*a* and 2*b*, 1695 seconds, or 28 minutes. The example demonstrates that a 12-fold secondary-ion intensity can be recorded in the same measurement time with no loss of mass resolution and with no disruptive peak interference. Adding the intensities for each species of secondary ion will produce the information in FIGS. 2*a* and 2*b* in half the measurement time. This represents a reduction in measurement time from 28 to 2.3 minutes.

The method in accordance with the present invention also curtails the time taken to obtain secondary-ion images. In this event, each pixel is analyzed as illustrated in FIGS. 2 or 3 and distribution images of the various secondary-ion species constructed.

Figure 4:
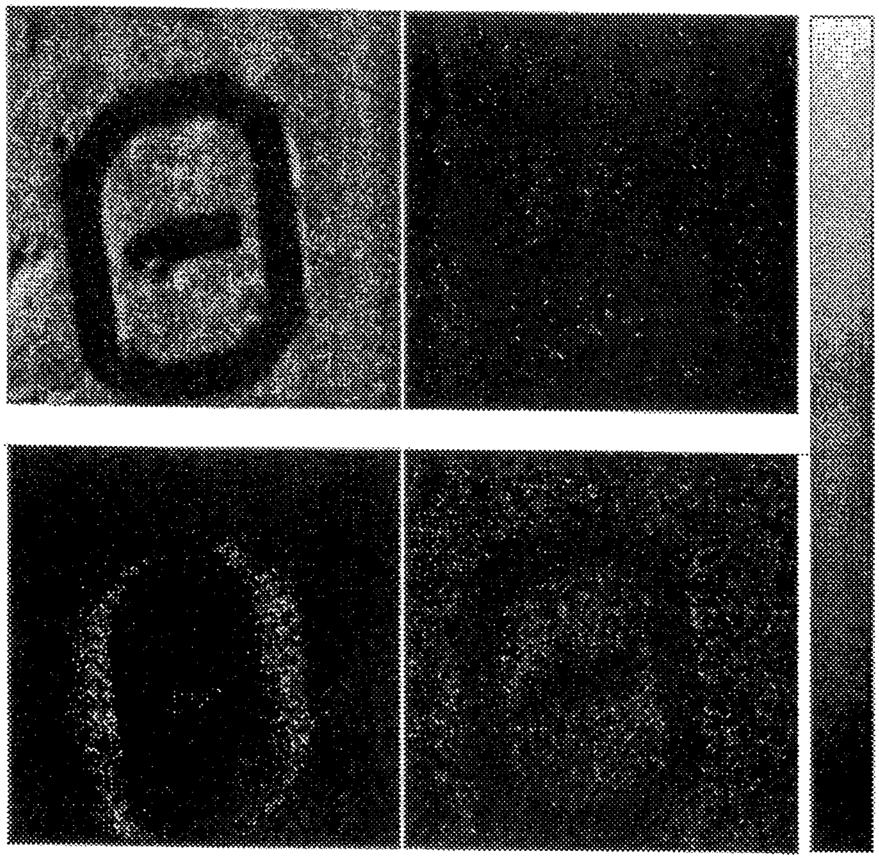
FIG. 4 represents secondary-ion distribution images obtained in accordance with the state of the art.

FIG. 4 illustrates distribution images obtained at the state of the art. A single primary-ion pulse was employed for each cycle. The events for each pixel were added and evaluated over 200 cycles. The overall measurement time for 256×256 pixels is 1310 seconds, or 22 minutes.

Figure 5:
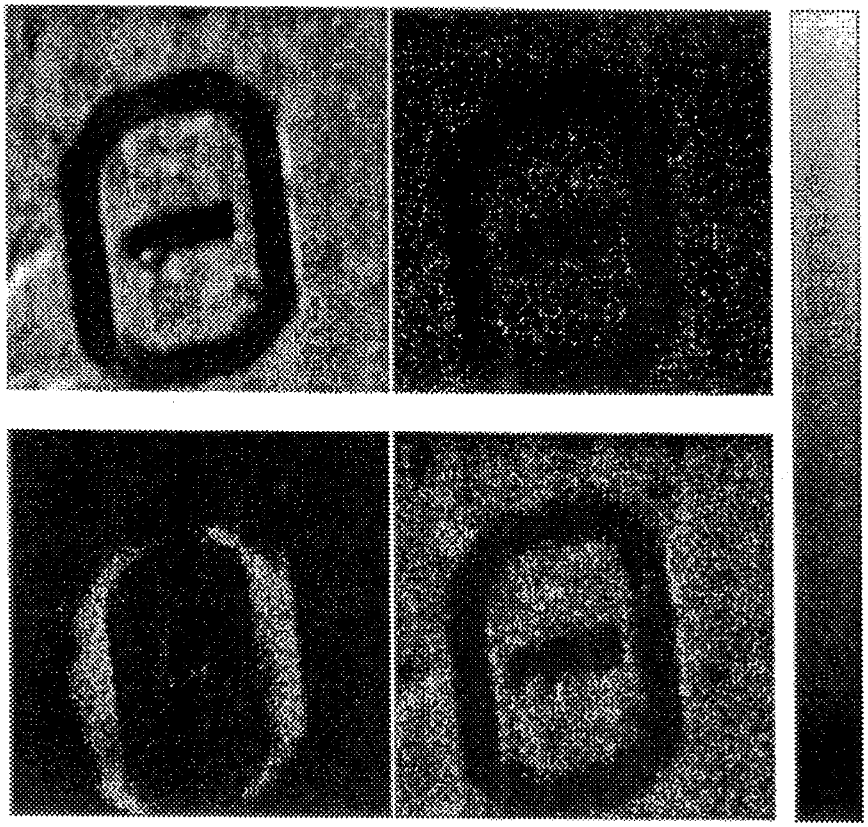
FIG. 5 represents secondary-ion distribution images obtained in accordance with the present invention.

FIG. 5 illustrates distribution images of the overall sample obtained in accordance with the present invention. A series of 12 subsidiary pulses at an interval of 25 nsec per cycle was employed. The events from 200 cycles were added and evaluated. The overall measurement time is, as will be evident from FIG. 5, 1310 seconds, or 22 minutes. The method in accordance with the present invention results in secondary-ion distribution images of a definitely higher intensity and dynamics at the same measurement time and the same content of information. In FIG. 4 for instance only 47 secondary $Al^+$ ions were recorded at the lightest pixel, whereas a total of 411 secondary ions were recorded at the lightest pixel in FIG. 5. Similar improvements in the images with no increase in exposure time will be evident for the distributions of $C_2H_3$, $Si^+$, and $AlH^+$. Exposure time is decreased by a factor of 12 with no sacrifice in imaging quality.

The series of time pulses in accordance with the present invention instead of a single pulses can also be employed for other purposes, especially for gas-phase analysis by time-of-flight mass spectroscopy. In this event the ions are generated by electron pulsing and accelerated. Their masses are then obtained by their time in flight. When a series is employed instead of a single electron pulse, the measurement time will be decreased just as effectively, *mutatis mutandis*, as in time-of-flight secondary-ion mass spectrometry.

There has thus been shown and described a novel process for operating a time-of-flight secondary-ion mass spectrometer which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. In a method of operating a time-of-flight secondary-ion mass spectrometer for the purpose of analyzing mass spectra wherein several finely structured ranges of mass appear in isolation and widely separated, and wherein a) the surface of a sample of material is bombarded at regular intervals (cycle times $t_z$) with primary-ion pulses, b) secondary ions of different mass are thereby released from the surface and are accelerated to the same level of energy, c) their mass-dependent time t of flight over a path 1 is measured and their mass determined therefrom, the improvement wherein d) every primary-ion pulse comprises several subsidiary pulses, e) every subsidiary pulse is short enough to allow resolution of the fine-structured measurement ranges, f) the interval $t_B$ between subsidiary pulses is longer than the fine-structured measurement ranges are wide, g) the number n of subsidiary pulses is selected to ensure that $n \cdot t_B$ is smaller than the distances between the fine-structured measurement ranges, and h) the n spectra associated with the subsidiary pulses in each fine-structured measurement range are added together.

2. A method as in claim 1, wherein the series consists of n=3–20 primary-ion pulses.

3. In a time-of-flight secondary-ion mass spectrometer for carrying out the method recited in claim 1, wherein a) the surface of a sample of material is bombarded at regular intervals (cycle times $t_z$) with primary-ion pulses, b) secondary ions of different mass are thereby released from the surface and are accelerated to the same level of energy, and c) their mass-dependent time t of flight over a path 1 is measured and their mass determined therefrom, the improvement comprising a source of pulsed primary ions that can bombard the surface of the sample within time $t_z$ with a series of n essentially identical primary ions at brief intervals $t_B$, wherein the interval $t_B$ between two primary-ion pulses is greater than the time-of-flight difference between the elemental and molecular ions in a nominal-mass range, and wherein the interval $t_A = n \cdot t_B$ between the first and last primary-ion pulse is shorter than the time-of-flight difference between the nominal masses in the detected range, wherein the n time-of-flight secondary-ion mass spectrometer associated with the same species of secondary ions can be added.

* * * * *